(12) United States Patent
Yang et al.

(10) Patent No.: US 7,952,146 B2
(45) Date of Patent: May 31, 2011

(54) GRAIN GROWTH PROMOTION LAYER FOR SEMICONDUCTOR INTERCONNECT STRUCTURES

(75) Inventors: Chih-Chao Yang, Poughkeepsie, NY (US); Shom Ponoth, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/709,928

(22) Filed: Feb. 22, 2010

(65) Prior Publication Data

US 2010/0148366 A1   Jun. 17, 2010

Related U.S. Application Data

(62) Division of application No. 11/307,761, filed on Feb. 21, 2006, now Pat. No. 7,666,787.

(51) Int. Cl.
*H01L 21/00* (2006.01)
(52) U.S. Cl. ......... 257/347; 257/E21.171; 257/E21.174; 257/E21.581; 257/E21.583; 257/E21.585
(58) Field of Classification Search ... 257/E21.171–174, 257/581–585
See application file for complete search history.

(56) References Cited

U.S. PATENT DOCUMENTS

| | | | |
|---|---|---|---|
| 5,098,860 A | 3/1992 | Chakravorty et al. | |
| 5,801,413 A | 9/1998 | Pan | |
| 5,930,641 A | 7/1999 | Pan | |
| 5,930,669 A | 7/1999 | Uzoh | |
| 5,933,753 A | 8/1999 | Simon et al. | |
| 6,242,349 B1 | 6/2001 | Nogami et al. | |
| 6,323,120 B1 | 11/2001 | Fujikawa et al. | |
| 6,383,920 B1 | 5/2002 | Wang et al. | |
| 6,429,519 B1 | 8/2002 | Uzoh | |
| 6,429,523 B1 | 8/2002 | Andricacos et al. | |
| 6,465,376 B2 | 10/2002 | Uzoh et al. | |
| 6,562,715 B1 | 5/2003 | Chen et al. | |
| 6,570,255 B2 | 5/2003 | Andricacos et al. | |
| 6,642,146 B1 | 11/2003 | Rozbicki et al. | |
| 6,670,270 B1 | 12/2003 | Ueno | |
| 6,753,251 B2 | 6/2004 | Ritzdorf et al. | |
| 6,768,202 B2 | 7/2004 | Oikawa et al. | |
| 6,812,147 B2 | 11/2004 | Skinner et al. | |
| 6,998,337 B1 | 2/2006 | Tran | |
| 7,119,018 B2 | 10/2006 | Lane et al. | |
| 7,241,677 B2 | 7/2007 | Soininen et al. | |
| 7,566,653 B2 * | 7/2009 | Yang et al. ............... | 438/627 |
| 2002/0105082 A1 | 8/2002 | Andricacos et al. | |
| 2002/0171151 A1 | 11/2002 | Andricacos et al. | |
| 2003/0001190 A1 | 1/2003 | Basceri et al. | |
| 2004/0061229 A1 | 4/2004 | Moslehi | |
| 2005/0093163 A1 | 5/2005 | Ho et al. | |
| 2009/0035954 A1 | 2/2009 | Yang et al. | |

\* cited by examiner

*Primary Examiner* — Michael S Lebentritt
(74) *Attorney, Agent, or Firm* — Scully, Scott, Murphy & Presser, P.C.; H. Daniel Schnurmann

(57) ABSTRACT

An interconnect structure of the single or dual damascene type and a method of forming the same, which substantially reduces the electromigration problem that is exhibited by prior art interconnect structures, are provided. In accordance with the present invention, a grain growth promotion layer, which promotes the formation of a conductive region within the interconnect structure that has a bamboo microstructure and an average grain size of larger than 0.05 microns is utilized. The inventive structure has improved performance and reliability.

20 Claims, 4 Drawing Sheets

GRAIN GROWTH PROMOTION LAYER FOR SEMICONDUCTOR INTERCONNECT STRUCTURES

CROSS REFERENCE TO RELATED APPLICATION

This application is a divisional of U.S. patent application Ser. No. 11/307,761, filed Feb. 21, 2006 the entire content and disclosure of which is incorporated herein by reference.

FIELD OF THE INVENTION

The present invention relates to a semiconductor structure and a method of fabricating the same. More particularly, the present invention relates to an interconnect structure of the single or dual damascene type in which a grain growth promotion layer is used to provide a conductive region within the interconnect structure that has a bamboo microstructure and an average grain size of larger than 0.05 microns. The presence of the conductive region having such a microstructure and a relatively large average grain size results in a structure that has enhanced performance and reliability. The present invention also relates to a method of fabricating such a semiconductor structure.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

One major problem with prior art interconnect structures is that the conductive material within the conductive region has a low electromigration resistance due to a high number of electromigration paths inside the conductive region. The high number of paths is believed to be a result of the microstructure and the average grain size of the conductive material. As is known to those skilled in the art, electromigration is predominately driven by (1) interface diffusion between the conductive material and the dielectric cap, and (2) bulk diffusion along the grain boundaries of the conductive material. The electromigration problem is expected to increase in future semiconductor technologies due to the scaling of such devices.

In view of the above-mentioned electromigration problem with prior art interconnect structures, there is a continued need to provide interconnect structures where the electromigration has been substantially reduced and/or eliminated.

SUMMARY OF THE INVENTION

The present invention provides an interconnect structure of the single or dual damascene type and a method of forming the same, which substantially reduces the electromigration problem that is exhibited by prior art interconnect structures. In accordance with the present invention, this objective is achieved by utilizing a grain growth promotion layer which promotes the formation of a conductive region within the interconnect structure that has a bamboo microstructure and an average grain size of larger than 0.05 microns.

The term "bamboo microstructure" is used throughout the instant application to denote that the conductive material of the interconnect is composed of grains all of which are larger than the cross sectional dimensions of the interconnect. A bamboo microstructure is different from a near bamboo microstructure which is a mixture of bamboo and polycrystalline microstructures along the length of the interconnect structure. A bamboo microstructure is also different from polycrystalline microstructures, which are also typically present in interconnect structures. The presence of the conductive region having such a microstructure and a relatively large average grain size results in a structure that has enhanced performance and reliability.

In general terms, the inventive interconnect structure comprises: a dielectric material including at least one opening therein; a diffusion barrier located within said at least one opening; a grain growth promotion layer located on said diffusion barrier; and an interconnect conductive material located within the at least one opening, said interconnect conductive material having a bamboo microstructure and an average grain size of larger than 0.05 microns.

In some embodiments of the present invention, a plating seed layer is formed on the grain growth promotion layer prior to forming the interconnect conductive material.

The present invention contemplates closed-via bottom structures, open-via bottom structures and anchored-via bottom structures.

In a preferred embodiment of the present invention, a Cu interconnect structure is provided that includes: a dielectric material including at least one opening therein; a diffusion barrier located within said at least one opening; a grain growth promotion layer located on said diffusion barrier; and a Cu interconnect metal located within the at least one opening, said Cu interconnect metal having a bamboo microstructure and an average grain size of larger than 0.05 microns.

In addition to providing the aforementioned interconnect structures, the present invention also provides a method of fabricating the same. In general terms, the method of the present invention includes: forming at least one opening in a dielectric material; forming a diffusion barrier on exposed wall portions of said dielectric material within said at least one opening; forming a grain growth promotion layer on said diffusion barrier; and forming an interconnect conductive material within said at least one opening atop said grain growth promotion layer, said interconnect conductive material having a bamboo microstructure and an average grain size of larger than 0.05 microns.

In a preferred embodiment of the present invention, the inventive method includes the steps of forming at least one opening in a dielectric material; forming a diffusion barrier on exposed wall portions of said dielectric material within said at least one opening; forming a grain growth promotion layer on said diffusion barrier; forming a Cu seed layer on said grain growth promotion layer; and forming a Cu interconnect metal from said Cu seed layer, wherein said Cu interconnect metal has a bamboo microstructure and an average grain size of larger than 0.05 microns.

BRIEF DESCRIPTION OF THE DRAWINGS

FIG. 6A includes an interconnect structure with an open-via bottom structure, while FIG. 6B includes an interconnect structure with an anchored-via bottom structure.

DETAILED DESCRIPTION OF THE PRESENT INVENTION

The present invention, which provides an interconnect structure including a grain growth promotion layer and a conductive region having a bamboo microstructure and an average grain size larger than 0.05 microns and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

Figure 1:
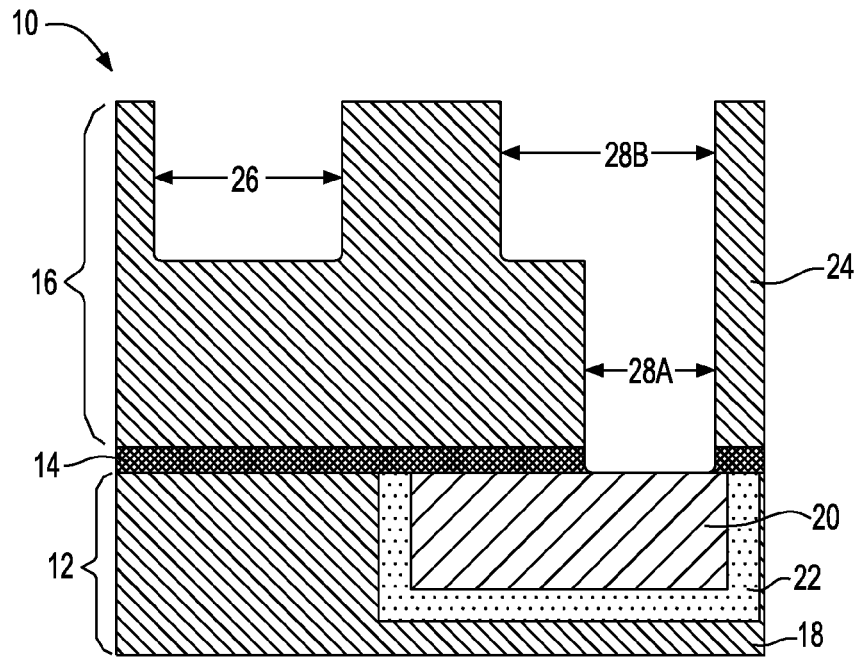
FIG. 1 is a pictorial representation (through a cross sectional view) illustrating an interconnect structure through initial stages of the inventive method wherein at least one opening is provided in a dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are separated in part by dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. In FIG. 1, two openings are shown; reference number 26 denotes a line opening for a single damascene structure, and reference numeral 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic cross talk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conductive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 22 may vary depending on the exact means of the deposition process as well as the material employed. Typically, the barrier layer 22 has a thickness from about 4 to about 40 nm, with a thickness from about 7 to about 20 nm being more typical.

Following the barrier layer 22 formation, the remaining region of the opening within the first dielectric material 18 is filled with a conductive material forming the conductive region. The conductive material used in forming the conductive region includes, for example, polySi, a conductive metal, an alloy comprising at least one conductive metal, a conductive metal silicide or combinations thereof. Preferably, the conductive material that is used in forming the conductive region is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer 22 and the conductive feature 20 each have an upper surface that is substantially coplanar with the upper surface of the first dielectric material 18.

Although not specifically illustrated, the inventive method described herein below can be used to provide the conductive feature 20 with a bamboo microstructure and an average grain size of larger than 0.05 microns. The term "average grain size" is used throughout this application to denote the average grain size inside the mentioned interconnect conductive material. The average grain size is measured utilizing standard techniques such as, for example, by placing a polished and etched specimen under a microscope and counting the number of grains inside a certain area, that are well known to those skilled in the art. The average grain size inside the microstructure is then calculated based on the known magnification, the number of grains, and the inspected area.

After forming the at least one conductive feature 20, the dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In FIG. 1, two openings are shown; reference number 26 denotes a line opening for a single damascene structure, and reference numeral 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 14 that is located atop the conductive feature 20 in order to make electrical contact between interconnect level 12 and level 16.

Next, a diffusion barrier 30 having diffusion barrier properties is provided by forming the diffusion barrier 30 on exposed surfaces (including wall surfaces within the opening) on the second dielectric material 24. The resultant structure is shown, for example, in FIG. 2. The diffusion barrier 30 comprises a same or different material as that of barrier layer 22. Thus, diffusion barrier 30 may comprise Ta, TaN, Ti, TiN, Ru, RuN, W, WN or any other material that can serve as a barrier to prevent a conductive material from diffusing there through. Combinations of these materials are also contemplated forming a multilayered stacked diffusion barrier. The diffusion barrier 30 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 30 may vary depending on the number of material layers within the barrier, the technique used in forming the same as well as the material of the diffusion barrier itself. Typically, the diffusion barrier 30 has a thickness from about 4 to about 40 nm, with a thickness from about 7 to about 20 nm being even more typical.

Figure 2:
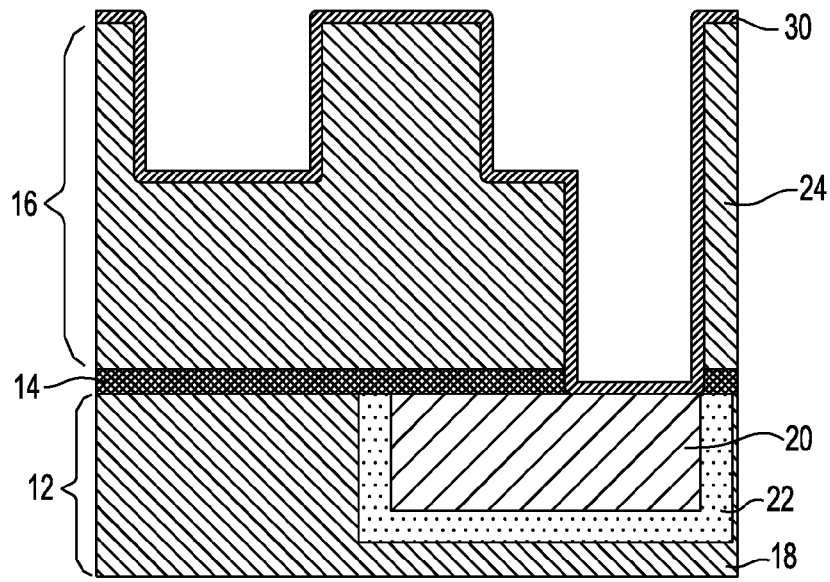
FIG. 2 is a pictorial representation (through a cross sectional view) illustrating the interconnect structure of FIG. 1 after formation of a diffusion barrier inside the at least the one opening.
Figure 3:
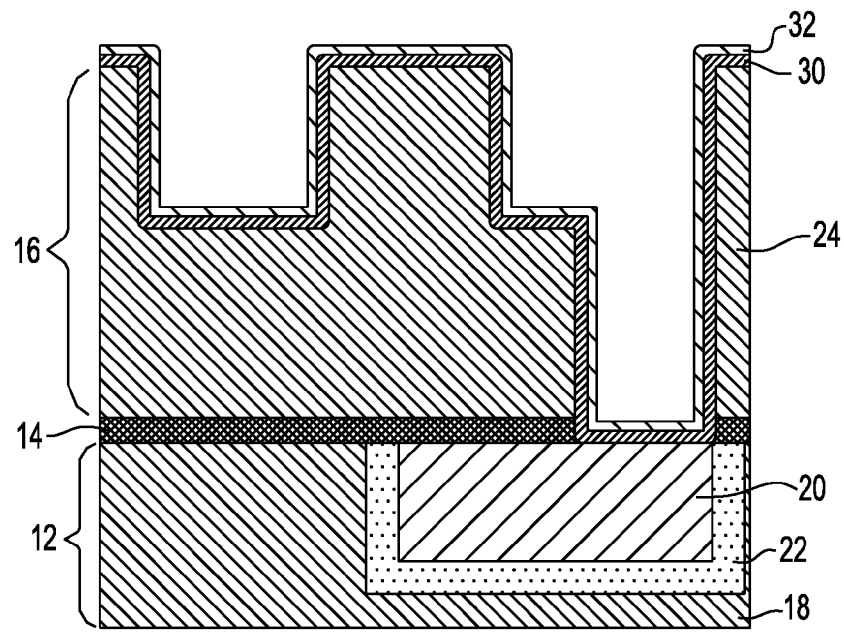
FIG. 3 is a pictorial representation (through a cross sectional view) illustrating the interconnect structure of FIG. 2 after formation of a grain growth promotion layer.

FIG. 3 shows the structure of FIG. 2 after formation of grain growth promotion layer (GGPL) 32 atop the diffusion barrier 30. The GGPL 32 is comprised of any material, typically a metal or metal alloy, that aids in the formation of a conductive material that has an average grain size of larger than 0.05 microns. Examples of suitable materials for the GGPL 32 include, but are not limited to: Ru, Ir, Rh, Mo, Re, Hf, Nb and alloys thereof. In some embodiments, it is preferred to use Ru, Ir or Rh as the GGPL 32.

The GGPL 32 is formed by a conventional deposition process including, for example, chemical vapor deposition (CVD), plasma enhanced chemical vapor deposition (PECVD), atomic layer deposition (ALD), and physical vapor deposition (PVP). The thickness of the GGPL 32 may vary depending on number of factors including, for example, the compositional material of the GGPL 32 and the technique that was used in forming the same. Typically, the GGPL 32 has a thickness from about 0.5 to about 10 nm, with a thickness of less than 6 nm being even more typical.

Without wishing to be bound by any theory, it is believed that the GGPL 32 aids in the formation of the conductive region having a bamboo microstructure and an average grain size of greater than 0.05 microns by a low interfacial energy between the GGPL 32 and later deposited seed layer 34/interconnect conductive material 38.

Figure 4:
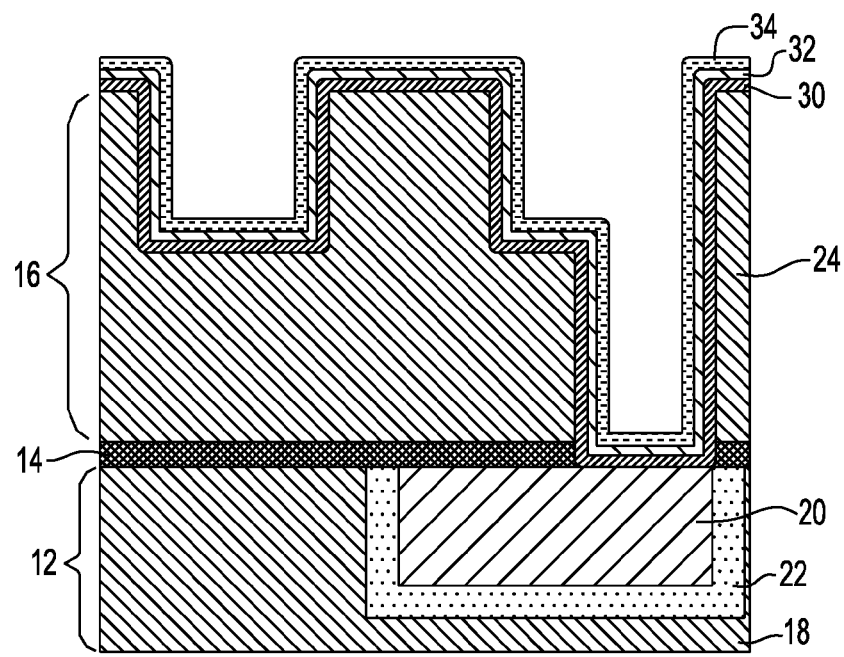
FIG. 4 is a pictorial representation (through a cross sectional view) illustrating the interconnect structure of FIG. 3 after formation of a plating seed layer.

FIG. 4 shows the resultant structure formed after forming a plating seed layer 34. The plating seed layer 34 is optional and need not be used in all instances. Although optional, it is preferred to include a plating seed layer 34 within the structure to aid in growth of the conductive material. This is especially the case when a conductive metal or metal alloy is to be subsequently formed within the at least one opening.

When present, the plating seed layer 34 may comprise a conductive metal or metal alloy such as that used in forming the conductive material 38 to be described in greater detail herein below. Typically, and when the conductive material 38 comprises Cu, the plating seed layer comprises Cu, CuAl, CuIr, CuTa, CuRh, or other alloys of Cu, i.e., Cu-containing alloys.

The plating seed layer 34 is formed by a conventional deposition process including, for example, ALD, CVD, PECVD, PVD, chemical solution deposition and other like deposition processes. The thickness of the plating seed layer 34 may vary and it is within ranges that are well known to those skilled in the art. Typically, the plating seed layer 34 has a thickness from about 2 to about 80 nm.

Figure 5:
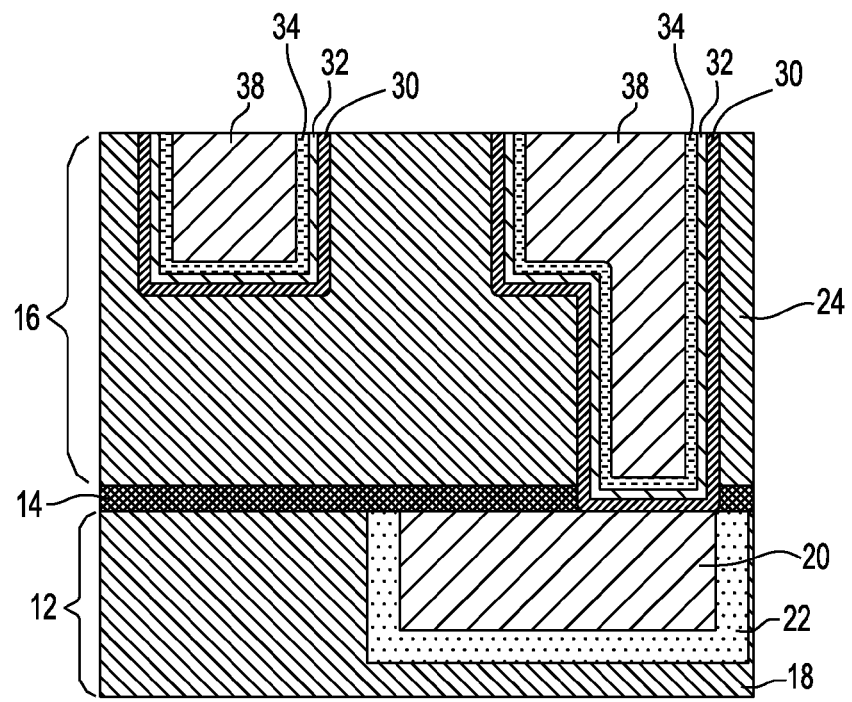
FIG. 5 is a pictorial representation (through a cross sectional view) illustrating the interconnect structure of FIG. 4 after formation of a conductive material within the at least one opening and subsequent planarization. In the illustrated structure, a closed-via bottom is illustrated on the right hand side.
Figure 6A:
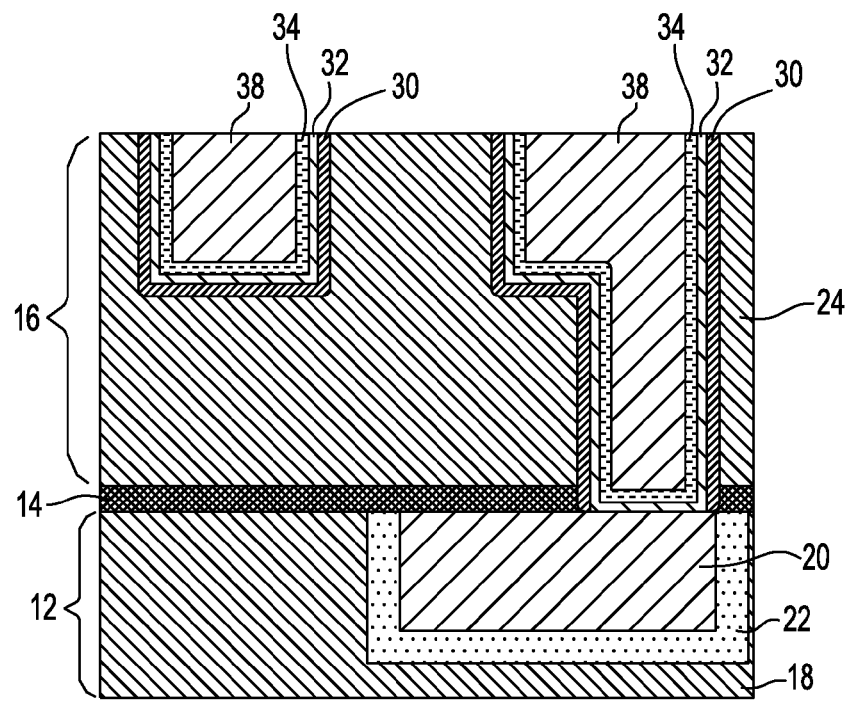
FIGS. 6A and 6B are pictorial representations (through cross sectional views) depicting alternative interconnect structure that can be formed utilizing the method of the present invention.
Figure 6B:
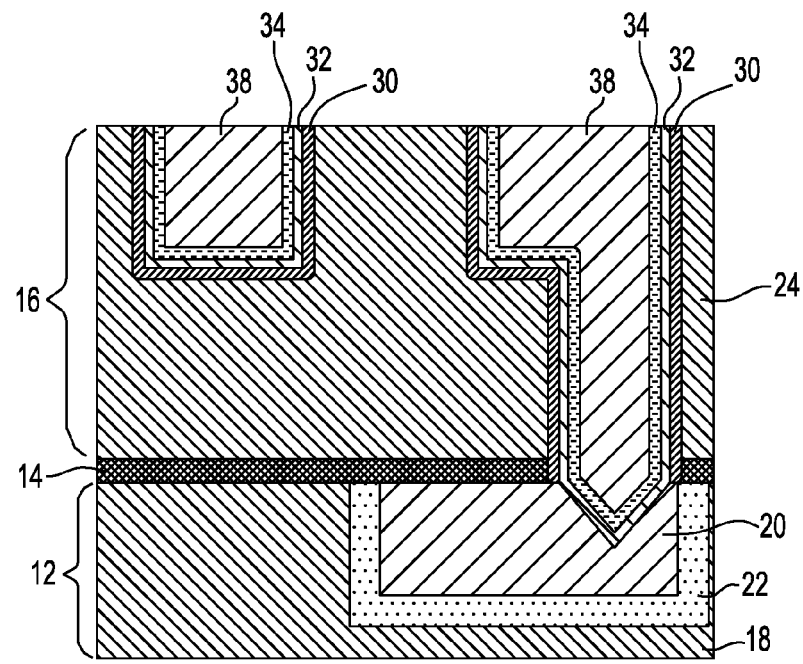

FIG. 5 shows the structure after forming an interconnect conductive material 38 within the at least one opening. The structure shown in FIG. 5 represents one possible embodiment of the present invention, while the structures shown in FIGS. 6A and 6B represent other possible embodiments of the present invention. In FIG. 5, a closed-via bottom structure is shown. In FIG. 6A, the interconnect conductive material 38 is formed within an open-via bottom structure. The open-via structure is formed by removing the diffusion barrier from the bottom of via 28A utilizing ion bombardment or another like directional etching process prior to deposition of the other elements. In FIG. 6B, an anchored-via bottom structure is shown. The anchored-via bottom structure is formed by first etching a recess into the conductive feature 20 utilizing a selective etching process. The diffusion barrier 30 is then formed and it is selectively removed from the bottom portion of the via and recess by utilizing one of the above-mentioned techniques. The other elements, i.e., GGPL 32, plating seed layer 34 and conductive material 38, are then formed within the opening as described herein.

In each of the illustrated structures, the interconnect conductive material 38 may comprise the same or different, preferably the same, conductive material as that of the conductive feature 20. Preferably, Cu, Al, W or alloys thereof are used, with Cu or AlCu being most preferred. The conductive material 38 is formed utilizing the same deposition processing as described above in forming the conductive feature 20 and following deposition of the conductive material, the structure is subjected to planarization. The planarization process removes the diffusion barrier 30, GGPL 32, plating seed layer 34 and conductive material 38 that is present above the upper horizontal surface of the upper interconnect level 16.

The method of the present application is applicable in forming such a conductive material as a conductive feature in any one or all of the interconnect levels of an interconnect structure. The same basic processing steps can be used to form other semiconductor structures, such as, for example, a field effect transistor, in which the conductive material is a gate electrode that has the inventive microstructure and average grain size.

As indicated above, the presence of the GGPL 32 aids in forming a conductive material 38 that has a bamboo microstructure. The term "bamboo microstructure" is a term of art for describing that the conductive material of the interconnect is composed of grains all of which are larger than the cross sectional dimensions of the interconnect. A bamboo microstructure is different from a near bamboo microstructure which is a mixture of bamboo and polycrystalline microstructures along the length of the interconnect structure. In the present invention, the conductive material 38 is also characterized as having an average grain size of larger than 0.05 microns. Typically, the average grain size of the conductive material 38 is from about 0.05 to about 0.5 microns, with an average grain size from about 0.08 to about 0.2 microns being even more typical.

The effects of the grain size and morphology of the conductive material 38 within an interconnect structure include the following:

The relatively large grain size of the conductive material 38 provides a conductive material 38 that has a low number of grain boundaries as compared to other morphologies, a low electron scattering effect (on the order of 10%~30% less than that of the prior art), and a relatively low electrical resistance (on the order of about 10%~30% less than that of the prior art. Because of these properties, the interconnect structure of the present invention exhibits better performance than conventional interconnect structure.

The bamboo microstructure provides less electromigration paths inside the conductive material 38, high electromigration resistance, and can withstand current density (of greater than 6 mA/$\mu$m$^2$), and thus, better circuit reliability.

Figure 7:
FIG. 7 is an electron micrograph of a region of an inventive interconnect structure.
Figure 8:
FIG. 8 is an electron micrograph of a region of a prior art interconnect structure.

Reference is now made to FIGS. 7 and 8 which are electron micrographs of a region of an inventive interconnect structure and a region of a prior art interconnect structure, respectively. The micrographs are cross sectional views that are parallel to the interconnect line. In both instances, Cu was used as the conductive material. In the inventive interconnect structure shown in FIG. 7, Ru was used as the grain growth promotion layer, while such a layer is absent from the prior art interconnect structure. As shown in FIG. 8, the Cu conductive material has an average grain size that is smaller than that of the inventive structure (See FIG. 7), and within the prior art Cu conductive region there appears to a greater number of grain boundaries than in the inventive structure. It's clear that the grain growth promotion layer existing in the structure shown in the FIG. 7 makes the Cu microstructure different, as compared to the one from the prior art shown in FIG. 8, i.e., large grain size with bamboo structure in FIG. 7 vs. small grain size with polycrystalline structure in FIG. 8. Without the grain growth promotion layer existing in the structure shown in FIG. 7, one wouldn't see the Cu microstructure difference between FIG. 7 and FIG. 8.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a dielectric material including at least one opening therein;
   a diffusion barrier located within said at least one opening;
   a grain growth promotion layer located on said diffusion barrier; and
   an interconnect conductive material located within the at least one opening, said interconnect conductive material having a bamboo microstructure and an average grain size of larger than 0.05 microns.

2. The interconnect structure of claim 1 wherein said dielectric material is one of SiO$_2$, a silsesquixoane, a C doped oxide that includes atoms of Si, C, O and H, or a thermosetting polyarylene ether.

3. The interconnect structure of claim 1 wherein said at least one opening is a line opening, a combined line opening and via opening, or combinations thereof.

4. The interconnect structure of claim 1 wherein said grain growth promotion layer comprises Ru, Ir, Rh, Mo, Re, Hf, Nb or alloys thereof.

5. The interconnect structure of claim 4 wherein said grain growth promotion layer comprises Ru, Ir, or Rh.

6. The interconnect structure of claim 1 wherein said grain growth promotion layer has a thickness from about 0.5 to about 10 nm.

7. The interconnect structure of claim 1 wherein said diffusion barrier comprises Ta, TaN, Ti, TiN, Ru, RuN, W, WN or any other material that can serve as a barrier to prevent conductive material from diffusing there through.

8. The interconnect structure of claim 1 further comprising a plating seed layer located between said grain growth promotion layer and said interconnect conductive material.

9. The interconnect structure of claim 8 wherein said plating seed layer comprises Cu or a Cu-containing alloy.

10. The interconnect structure of claim 1 wherein said interconnect conductive material is one of polySi, a conductive metal, an alloys comprising at least one conductive metal, or a conductive metal silicide.

11. The interconnect structure of claim 10 wherein said interconnect conductive material is a conductive metal selected from the group consisting of Cu, Al, W and AlCu.

12. The interconnect structure of claim 1 wherein said interconnect conductive material comprises Cu and said grain growth promotion layer comprises Ru, Ir or Rh.

13. The interconnect structure of claim 1 wherein said interconnect conductive material is present in an open-via bottom or an anchored-via bottom structure.

14. The interconnect structure of claim 1 wherein said interconnect conductive material is present in a closed-bottom via.

15. An interconnect structure comprising:
a dielectric material including at least one opening therein;
a diffusion barrier located within said at least one opening;
a grain growth promotion layer located on said diffusion barrier; and
a Cu interconnect metal located within the at least one opening, said Cu interconnect metal having a bamboo microstructure and an average grain size of larger than 0.05 microns.

16. The interconnect structure of claim 15 wherein said grain growth promotion layer comprises Ru, Ir, Rh, Mo, Re, Hf, Nb or alloys thereof.

17. The interconnect structure of claim 16 wherein said grain growth promotion layer comprises Ru, Ir, or Rh.

18. The interconnect structure of claim 15 wherein said grain growth promotion layer has a thickness from about 0.5 to about 10 nm.

19. The interconnect structure of claim 15 wherein said interconnect conductive material is present in an open-via bottom or an anchored-via bottom structure.

20. The interconnect structure of claim 15 wherein said interconnect conductive material is present in a closed-via bottom structure.

* * * * *